(12) United States Patent
Hankhofer et al.

(10) Patent No.: US 8,522,051 B2
(45) Date of Patent: Aug. 27, 2013

(54) PROTECTION FOR CIRCUIT BOARDS

(75) Inventors: Johannes Hankhofer, Aiterhofen (DE); Manfred Mengel, Bad Abbach (DE); Stephan Schaecher, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1598 days.

(21) Appl. No.: 11/745,220

(22) Filed: May 7, 2007

(65) Prior Publication Data

US 2008/0278217 A1    Nov. 13, 2008

(51) Int. Cl.
G06F 21/00    (2006.01)

(52) U.S. Cl.
USPC .............................. 713/194; 73/790; 29/846

(58) Field of Classification Search
USPC ................................................ 713/182, 194
See application file for complete search history.

(56) References Cited

U.S. PATENT DOCUMENTS

| | | | |
|---|---|---|---|
| 5,060,261 A * | 10/1991 | Avenier et al. ................ | 713/194 |
| 5,136,366 A | 8/1992 | Worp et al. | |
| 5,233,505 A | 8/1993 | Chang et al. | |
| RE34,794 E | 11/1994 | Farnworth | |
| 6,023,098 A * | 2/2000 | Higashiguchi et al. ....... | 257/712 |
| 6,209,403 B1 * | 4/2001 | Chen et al. ............... | 73/862.627 |
| 6,233,339 B1 | 5/2001 | Kawano et al. | |
| 6,245,992 B1 | 6/2001 | Hou | |
| 6,273,339 B1 | 8/2001 | Tuttle et al. | |
| 6,355,316 B1 | 3/2002 | Miller et al. | |
| 6,709,891 B2 * | 3/2004 | Crane et al. ................... | 438/110 |
| 6,850,607 B2 | 2/2005 | Meyer et al. | |
| 6,894,501 B1 | 5/2005 | Flasck et al. | |
| 6,957,345 B2 * | 10/2005 | Cesana et al. ................ | 713/194 |
| 7,039,815 B1 | 5/2006 | Grassl et al. | |
| 7,199,653 B2 | 4/2007 | Miyata | |
| 7,309,907 B2 | 12/2007 | De Jongh et al. | |
| 7,640,658 B1 * | 1/2010 | Pham et al. ..................... | 29/846 |
| 7,663,215 B2 * | 2/2010 | Tuominen et al. ............ | 257/686 |
| 2003/0132777 A1 | 7/2003 | Laackmann et al. | |
| 2003/0150276 A1 * | 8/2003 | Christensen et al. ........... | 73/795 |
| 2005/0081049 A1 * | 4/2005 | Nakayama et al. ........... | 713/194 |
| 2006/0049941 A1 | 3/2006 | Hunter et al. | |
| 2006/0148317 A1 | 7/2006 | Akaike et al. | |
| 2006/0163707 A1 | 7/2006 | Hooi | |

(Continued)

FOREIGN PATENT DOCUMENTS

| | | |
|---|---|---|
| CN | 2397605 | 9/2000 |
| CN | 1596470 | 3/2005 |

(Continued)

OTHER PUBLICATIONS

Duk-Soo Eun, "Design and Fabrication of a MEMS-based multi-sensor", 2008, IEEE, pp. 588-591.*

(Continued)

*Primary Examiner* — Taghi Arani
*Assistant Examiner* — Gregory Lane
(74) *Attorney, Agent, or Firm* — Dicke, Billig & Czaja, PLLC

(57) ABSTRACT

A system comprising a circuit board and an integrated circuit device mounted on the circuit board by means of an external contact, and comprising an anti-tamper device being connectable to the external contact to switch the integrated circuit device into a safe mode upon application of a predetermined electrical state at the external contact is described.

35 Claims, 14 Drawing Sheets

(56) References Cited

U.S. PATENT DOCUMENTS

| | | | |
|---|---|---|---|
| 2006/0259788 A1* | 11/2006 | Elbert et al. | 713/194 |
| 2007/0151358 A1* | 7/2007 | Chien et al. | 73/790 |
| 2007/0162759 A1* | 7/2007 | Buskey et al. | 713/182 |
| 2007/0190846 A1* | 8/2007 | Yamashita et al. | 439/465 |
| 2007/0226807 A1* | 9/2007 | Ginter et al. | 726/27 |
| 2008/0001741 A1* | 1/2008 | Cobianu et al. | 340/568.2 |

FOREIGN PATENT DOCUMENTS

| | | |
|---|---|---|
| DE | 19512266 | 3/1996 |
| DE | 20112350 | 2/2002 |
| DE | 102006010284 | 3/2007 |
| EP | 0417648 | 3/1991 |
| EP | 1054316 | 11/2000 |
| EP | 1089219 | 4/2001 |
| EP | 1478018 | 11/2004 |
| JP | 05190771 A | 7/1993 |
| WO | 2005098950 | 10/2005 |
| WO | WO2007041575 | * 4/2007 |

OTHER PUBLICATIONS

An Office Action for U.S. Appl. No. 11/673,253 mailed on Jul. 20, 2010 (21 pages).

The Office Action for U.S. Appl. No. 11/673,253 mailed Dec. 22, 2010 (18 pages).

* cited by examiner

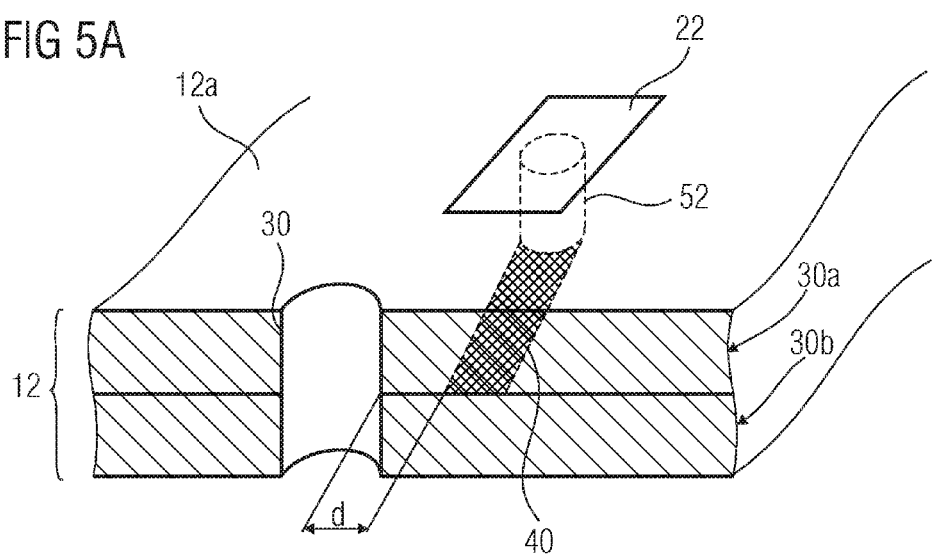
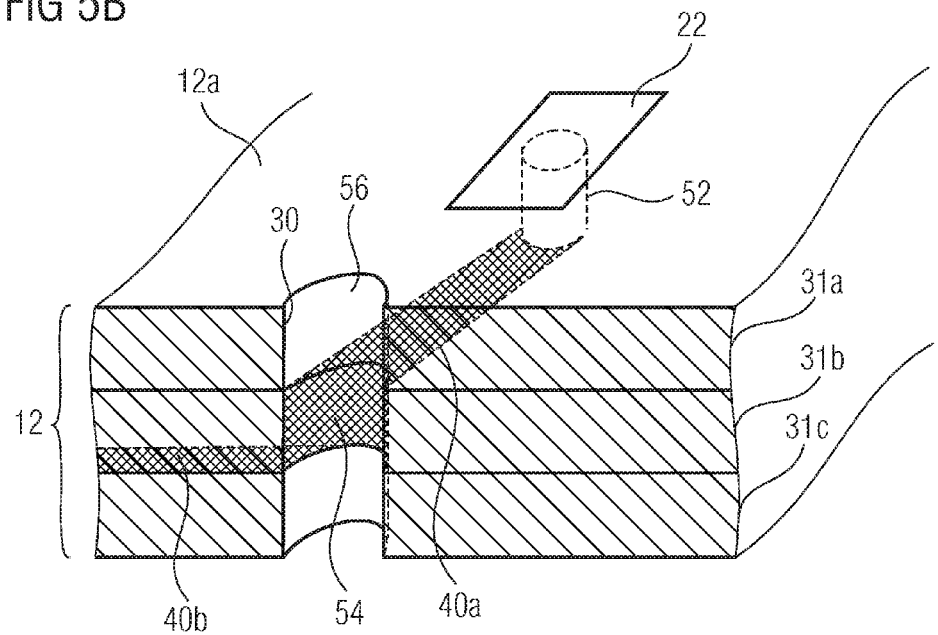

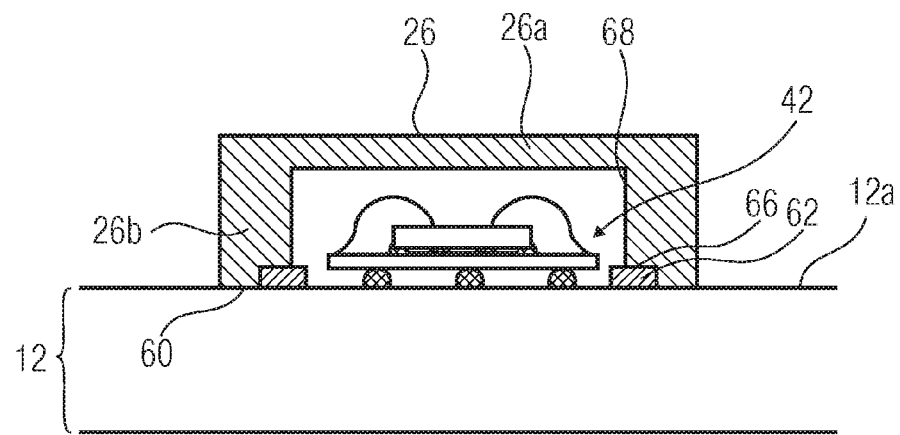
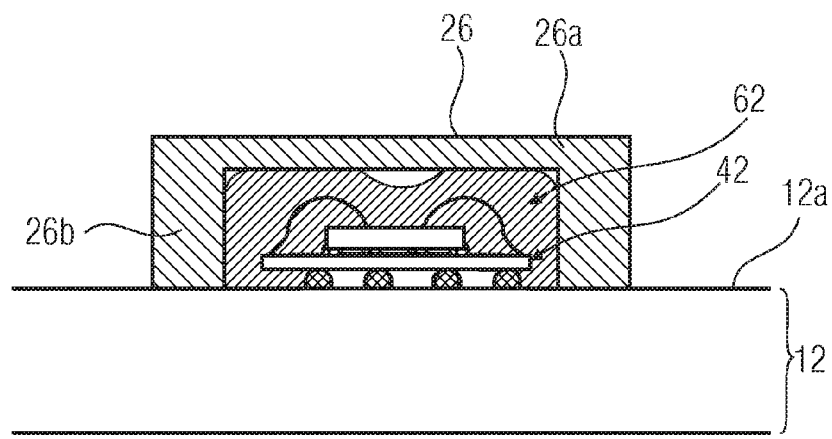

PROTECTION FOR CIRCUIT BOARDS

BACKGROUND

The present invention relates to a protection for circuit boards against tampering.

In some applications, it would be favourable to be able to prevent circuit boards from abuse. For example, there is a need to protect the information in ICs in any business model where a IC containing device is given to the consumer at a reduced price with the obligation to use that device only with services from a certain provider. One already existing example for this kind of business model is the Simlock Cellphone® where the device is programmed to be only functioning using the Simcard from a specific provider. Similar need for protection exists for pay-per-use business models or receiving content over mass distributed channels, e.g. Cable and Satellite Pay TV.

SHORT DESCRIPTION OF THE DRAWINGS

Referring to the figures, embodiments of the present invention are described in more detail below. In particular FIG. 1a shows a perspective view of a circuit board with a protection according to one embodiment of the present invention;

FIGS. 3b and 3c show side and bottom views of the protective cap of FIG. 3a;

FIG. 5a shows a perspective sectional view of a circuit board for illustrating a possible placement of an anchoring pin hole relative to a conductor line of the circuit board;

FIG. 5 shows a perspective sectional view of a circuit board for illustrating another possibility for the placement of an anchoring pin hole relative to a conductor line of the circuit board;

FIG. 6a to 6d show sectional side views of an arrangement of a circuit board, an integrated circuit to be protected and a protective cap according to further embodiments of the present invention;

DETAILED DESCRIPTION

In the following description, same elements or elements corresponding to each other in terms of functionality are given the same reference numbers, and a repetitive description of same is avoided.

Figure 1A:
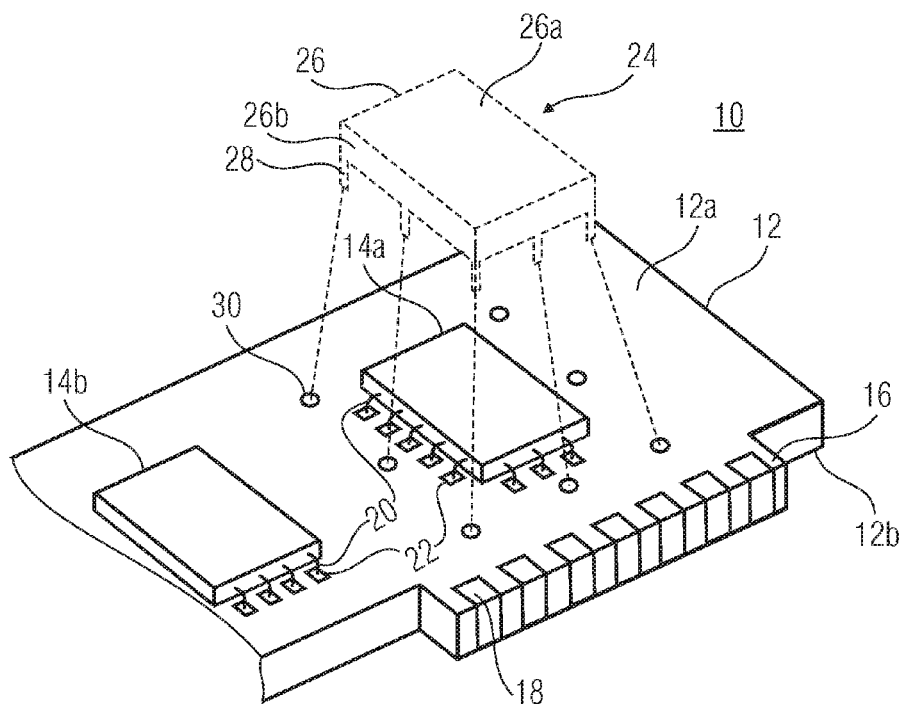
FIG. 1b shows a block diagram of a circuit board system according to an embodiment.
FIG. 1c shows a sectional partial view of a circuit board having an integrated circuit mounted thereon according to an embodiment.
FIG. 1d shows a sectional partial view of a circuit board having an integrated circuit mounted thereon according to another embodiment.
FIGS. 1e to 1g show schematic diagrams of an integrated circuit according to several embodiments to illustrate various possibilities to detect tampering with the circuit board or parts thereof.

FIG. 1a shows a system 10 comprising a circuit board 12 having several integrated circuits 14a, 14b mounted thereon and comprising a plug portion 16 at a circumferential portion of the circuit board 12. The plug portion 16 has external electrodes 18 formed thereon so as to form an external interface to an external device such as the motherboard of a computer, when the circuit board 12 has been plugged into a respective slot (not shown).

Integrated circuits 14a, 14b are mounted onto a mounting surface 12a of the circuit board 12. A surface 12b of the circuit board 12 being opposed to the mounting surface 12a may, or may not serve as a mounting surface for further integrated circuits (not shown) as well.

Exemplarily, merely two integrated circuits 14a, 14b are shown in FIG. 1a as being mounted to the circuit board 12. However, additional integrated circuits may be mounted to the circuit board 12 in a portion of the circuit board 12 not shown in FIG. 1a. Alternatively, merely integrated circuit 14a may be mounted on the circuit board 12.

In FIG. 1a, the integrated circuits 14a, 14b are shown as packaged chips being directly mounted onto the circuit board 12 via external contacts 20. However, as will be shown in the following embodiments, it is also possible that an integrated circuit is part of a chip module comprising a chip support substrate having one or several chips with an integrated circuit mounted thereon on a first side, and having external contacts for a connection to the circuit board 12 on an opposing surface. Similarly, although the external contacts 20 are shown as conductor legs extending from a side surface of the integrated circuit 14a, 14b, same could also be implemented as terminal pads on a mounting surface of the integrated circuit 14a, 14b defining the footprint thereof and facing the mounting surface 12a of the circuit board 12. This will be described in more detail below with respect to FIGS. 1c and 1d.

In particular, the integrated circuits 14a, 14b are mounted to the circuit board such that the external electrodes 20 thereof are electrically connected to contact pads 22 disposed on the mounting surface 12a of the circuit board 12.

For example, the external contacts 20 are soldered to the contact pads 22. Alternatively, an electrically conductive adhesive may be used to achieve mechanical and electrical connection between the external contacts 20 and the contact pads 22.

The circuit board 12 comprises conductor lines interconnecting contact pads 22 and electrodes 18 so as to form an electrical circuit for performing a certain functionality. In FIG. 1, the circuit board 12 is exemplarily a multi-layer circuit board with conductor lines extending internally thereto, between the layers of the circuit board 12 and with through holes providing electrical contact between conductor lines, contact pads 22 and electrodes 18, respectively. However, as a precautionary measure only, it is noted that the present invention may also be applied to a circuit board 12 having conductor lines interconnecting the contact pads 22 disposed on the mounting surface 12a.

Among the integrated circuits 14a, 14b, integrated circuit 14b is, for example, a processor being able of executing computer programs running thereon. The integrated circuit 14a may comprise an encryption unit that participates in the cooperation of the integrated circuits 14a, 14b in connection with, for example, a functionality of interest of the circuit board 12, such that the functionality is not activatable or is defective, when the integrated circuit 14a has been removed. In this regard, the integrated circuit 14a should be protected as it is described in the following. Alternatively or additionally, the integrated circuit 14a could participate in the desired functionality of the circuit board 12 such that the data being transmitted via the external contacts 20 of the integrated circuit 14a should be protected from a spy out or a manipulation from outside. Such data could, for example, relate to the duration of usage of the desired functionality of the circuit board 12 or other pay per use data. In this regard, the integrated circuit 14a could also be an integrated circuit that should be protected from outside. In the following, embodiments for providing this protection will be described. It should be noted that the encryption unit for the integrated circuit 14a may comprise an asymmetric or a symmetric encryption unit. For example, the integrated circuit 14a may implement a RSA or an elliptic curve algorithm. Alternatively, the integrated circuit 14a may implement an AES, DES, or Triple-DES algorithm.

In order to protect system 10 of FIG. 1a against tampering, the integrated circuit 14a, for example, has an anti-tamper circuit (not shown in FIG. 1a) integrated therein, the anti-tamper circuit being connectable to the external contact 20 to switch the integrated circuit 14a into a safe mode upon application of a predetermined electrical state at the external contact 20 of integrated circuit 14a. In other words, within integrated circuit 14a, the anti-tamper circuit observes or monitors an electrical state on at least one of its external contacts 20 in order to detect any presence of a tampering event, such as a short circuiting of external contacts 20 of integrated circuits 14a, or an interruption of any of the connections between the external contact 20 of integrated circuit 14a on the one hand and respective contact pads 22 on the other hand. In even other words, the anti-tamper circuit checks as to whether the detected electrical state fulfils predetermined conditions corresponding to a high likelihood of an unauthorized person tampering with the system. In case of such detected tampering, the anti-tamper circuit outputs, for example, an alarm signal resulting in switching the integrated circuit 14a into a safe mode, thereby preventing the functionality of interest of circuit board 12 from being operable. The electrical state being observed may comprise a resistance, a capacitance and/or an inductance and the corresponding measurement my involve a current and/or voltage measurement. Further details with respect to the anti-tamper circuit and its mode of operation are described in more detail below with respect to FIGS. 1b to 1d.

As another optional protection means, the system 10 of FIG. 1a may comprise a cover 24 connected to the circuit board and covering, for example, at least the external contents 20 against a manipulation of the data communicated via the external contacts 20. In FIG. 1, the cover 24 comprises a protective cap 26 comprising a top surface 26a and a sidewall 26b. As shown in the exploded view of FIG. 1, the protective cap 26 is affixed to the circuit board, such that the sidewalls 26b encircle the integrated circuit 14a including the external contacts 20 and the contact pads 22 of the circuit board 12 to which they are connected, and such that the integrated circuit 14a is enclosed by the protective cap 26 and the circuit board 12, and any external access to the external contacts 20 is prohibited by the protective cap 26. In particular, as shown in FIG. 1, the protective cap 26 comprises anchoring pins 28 extending through respective holes 30 in the circuit board 12, so as to support or provide for the affixation of the protective cap 26 to the circuit board 12. The protective cap 26 may be affixed to the circuit board such that the protective cap 26 is electrically isolated from any conductive part of the circuit board 12 such as from the conductor lines, the contact pads 22, and the electrodes 18.

Several embodiments for the optional cover 24 will be described in the following with respect to FIGS. 2a to 10. It should be noted that the cover 24 not necessarily has to be implemented as a protective cap 26 having anchoring pins 28. However, preferably, the cover 24 is affixed to the circuit board 12 in an irreversible fashion, i.e. such that it is not possible to remove the cover 24, without destroying the circuitry of the circuit board 12, including the integrated circuits 14a, 14b, and the conductor lines interconnecting the contact pads 22. Even more preferably, the relationship between the labour necessary to remove the cover 24 from the circuit board 12 and the damage to the circuitry of the circuit board 12 resulting therefrom should be such, that the costs for the removal and the repair exceed a prospective gain associated with the removal due to, for example, the manipulation of the pay per use data communicated to the integrated circuit 14a.

Figure 1B:
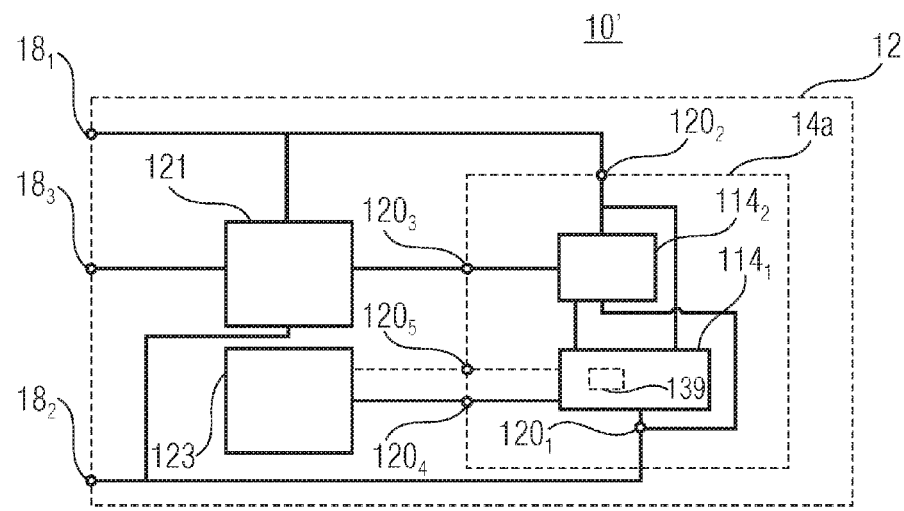

After having described an embodiment of a system comprising a circuit board and an integrated circuit with respect to FIG. 1a, FIG. 1b shows a more general representation of a system comprising a circuit board 12 and an integrated circuit 14a in order to illustrate an embodiment for a mode of operation of such a system 10' in terms of dealing with tampering attempts. According to FIG. 1b, the integrated circuit 14a has an anti-tamper circuit $114_1$ and a normal-mode circuit $114_2$ integrated therein, with the anti-tamper circuit $114_1$ having already been mentioned above, and the normal-mode circuit $114_2$ comprising, for example, an encryption unit as also described above. The integrated circuit 14a is mounted to the circuit board 12 by means of external contacts $120_1$ to $120_5$. Among these external contacts, external contact $120_1$ may act as a ground terminal, whereas external contact $120_2$ may act as a power supply terminal of integrated circuit 14a. Further, external contact or external contacts $120_3$ may be provided to allow data communication between the integrated circuit 14a and outside. The normal-mode circuit $114_2$ may be connected to the just mentioned external contacts $120_1$ to $120_3$ so as to, if powered via external contacts $120_1$ and $120_2$, participate in the functionality of system 10' by communicating with external circuitry 121 partially being formed within circuit board 12 in the form of, for example, conductor lines and other devices, such as other integrated circuits 14b, mounted to circuit board 12. The communication between this external circuitry 121 and the normal-mode circuit $114_2$ is performed via external contact(s) $120_3$.

Anti-tamper circuit $114_1$ may also be connected between external contacts $120_1$ and $120_2$. Besides this, anti-tamper circuit $114_1$ is connected to external contacts $120_4$ and $120_5$ in order to observe electrical states at these external contacts. Via external contacts $120_4$ and $120_5$, anti-tamper circuit $114_1$ is connected to anti-tamper circuitry 123 comprising, for example, conductor lines of circuit board 12, electrical devices mounted on circuit board 12 and/or a conductive path running through cover 24. Examples for anti-tamper circuitry 123 will be described in the following in more detail. For the sake of completeness only, it is noted that the integrated circuit board 14a may be connected between respective ground and source external electrodes $18_1$ and $18_2$ of circuit board 12 by respective conductor lines of circuit board 12, and that the external circuitry 121 may be also connected between these external electrodes $18_1$ and $18_2$. Together, the normal-mode circuit $114_2$ and the external circuitry 121 form a circuitry suitable for performing the functionality of interest of system 10', with this circuitry being connected, for example, to a respective I/O electrode $18_3$ of circuit board 12. Although, in FIG. 1b, the circuitry being composed of both circuitry 121 as well as normal-mode circuit $114_2$ is shown to be connected to I/O external electrode $18_3$ via external circuitry 121, it may also be possible that, alternatively or additionally, external contact $120_3$ is connected to I/O external electrode $18_3$.

Besides the above-mentioned interconnections, the anti-tamper circuit $114_1$ is coupled to the normal-mode circuit $114_2$. The interconnection enables the anti-tamper circuit $114_1$ preventing the overall circuitry comprising external circuitry 121 and internal circuit $114_2$ from performing the functionality of interest of system 10' in case of an electrical state being present on external contact $120_4$ and $120_5$ indicating a tampering event.

Figure 1C:
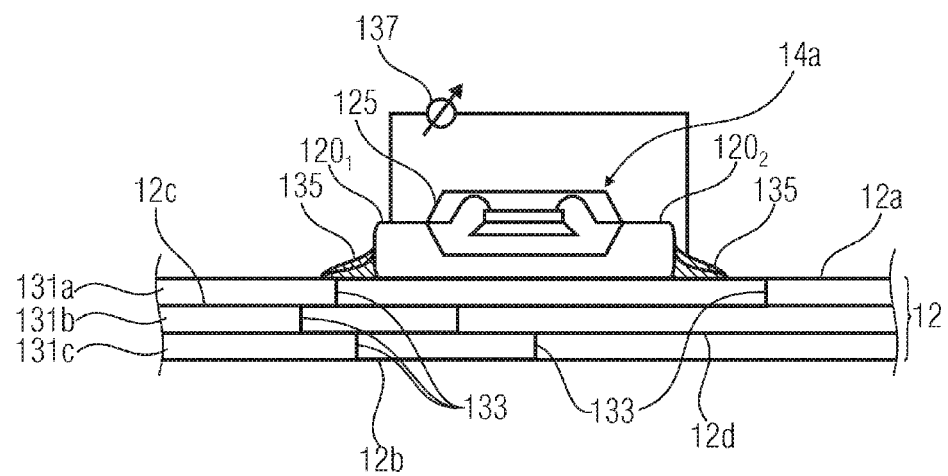

For example, anti-tamper circuit $114_1$ performs an electrical resistance measurement on the two sense locations or external contacts $120_4$ and $120_5$ in order to check as to whether a tampering event currently exists or not. This is illustrated in FIG. 1c, which shows an exemplary sectional view of circuit board 12 having mounted thereon integrated circuit 14a. In FIG. 1c, the integrated circuit 14a is exemplary shown to be packaged into an IC-package 125 with electrode legs serving as the external contacts such as external contacts $120_1$ and $120_2$. In the embodiment of FIG. 1c, the circuit board 12 is exemplary embodied as a multi-layer circuit board being composed of several layers 131a, 131b and 131c defining a top mounting surface 12a onto which the integrated circuit 14a is mounted and an opposed bottom surface 12b as well as inner interfaces 12c and 12d. Each of surfaces/interfaces 12e to 12d defines a metal layer, i.e. a top, bottom or inner layer within which conductor lines of circuit board 12 extend in order to define the interconnections between the components mounted to circuit board 12a such as integrated circuit 14a. Vias 133 extend through layers 131a to 131c in predefined positions in order to interconnect conductor lines formed in distinct metal layers 12a to 12d. As also shown in FIG. 1c, the integrated circuit 14a and, in particular, the external contacts $120_1$ and $120_2$ may be connected to circuit board 12a on contact pads thereof by means of soldered joints 135.

FIG. 1c illustrates the case that the anti-tamper circuit within integrated circuit 14a performs a resistance measurement illustrated at 137 in FIG. 1c, between external contacts 121 and 122. For example, the external contacts 121 to 122 are connected to each other via conductor lines and vias 133 of circuit board 12, these conductor lines and vias defining the continuous electrically conductive path running through circuit board 12 so as to extend to and/or cross several of layers 12a to 12d.

In case of an unauthorized person trying to short-cut some of the external contacts or remove the integrated circuit 14a from circuit board 12, the resistance measured between external contacts 121 and 122 are likely to change in an observable way such as by exceeding a predetermined threshold.

According to an embodiment, a resistance measurement 137 is performed before the issuance of the system to the customer after having mounted the integrated circuit 14a to circuit board 12. The result of this pre-issuance measurement may be stored in a memory 139 of anti-tamper circuit $114_1$ (see FIG. 1d), the memory 139 being, for example, an embedded flash memory of integrated circuit 14a. This result is then used by anti-tamper circuit $114_1$ as a control value based on which the anti-tamper circuit $114_1$ decides as to whether resistance values which are, for example, intermittently detected indicate a normal or non-tamper state or indicate a tamper state in case of which the anti-tamper circuit $114_1$ may disable normal-mode circuit $114_2$. By this measure, for example, the integrated circuit 14a switches into a lock mode upon changes in the hardware of system 10'. The imprinting of the pre-issuances measurement data may be performed during a functional test, wherein the integrated circuit 14a may be designed such that this measurement data may only be changed or deleted by the manufacturer of system 10', such as by use of a required secret code.

It is noted that, of course, in case of FIG. 1c a capacitance measurement or an inductance measurement may be performed instead of the aforementioned resistance measurement. The actually measured value, however, may by a current or voltage value. Moreover, a combination of a resistance, inductance and/or capacitance measurement values may be used to detect a tampering event. Thus, a combination of these values may be stored in memory 139. Such a combination may have a higher degree of safety or a higher degree of sensitivity against tampering attacks.

Figure 1D:
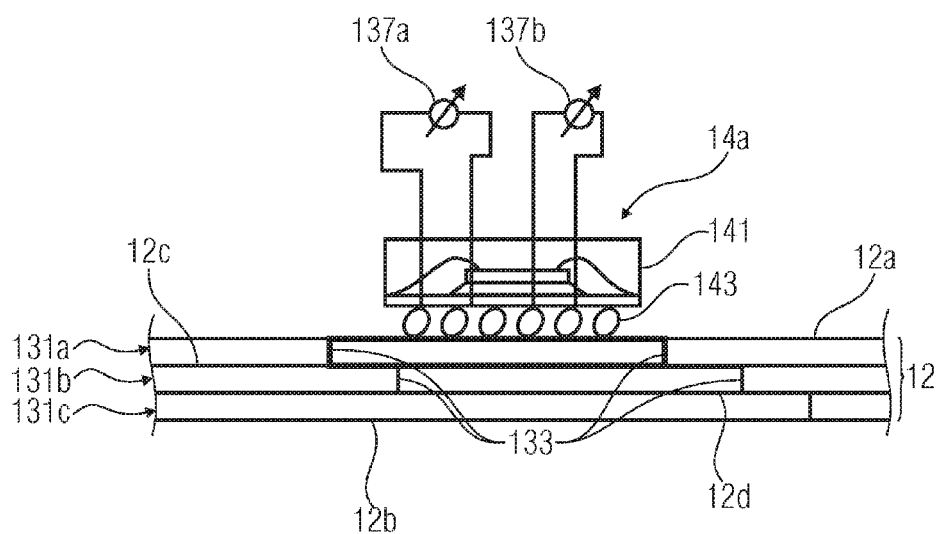

In this regard, FIG. 1d shows another exemplary side view of circuit board 12 having integrated circuit 14a mounted thereon. In case of FIG. 1d, however, the integrated circuit 14a is exemplified as being packaged into a IC-package 141 such as a lead frame package having a footprint of electrode pads being connected to respective contact pads of circuit board 12 via solder balls 143. Further deferring from FIG. 1c, according to FIG. 1d, the anti-tamper circuit $114_1$ is connected to two pairs of external contacts, with a resistance measurement 137a and 137b being performed on each of these pairs. Different conductive paths running through circuit board 12 in different ways may be formed within circuit board 12 by means of conductor lines and wires 133 to be connected to each of these pairs of external contacts.

In case of FIG. 1d, for example, the anti-tamper circuit $114_1$ performs a first resistance measurement 137a on the first pair of external contacts and a second resistance measurement 137b on the second pair of external contacts of integrated circuit 14a. Then, circuit $114_1$ uses these resistance values to check as to whether these values indicate an alarm situation. For example, circuit $114_1$ compares these values or a combination thereof with a pre-stored value stored within memory 139 as discussed above with respect to FIG. 1c. The comparison may provide a range of an allowed discrepancy between the stored and the measured values so as to avoid a false activation of the tampering alarm signal by which system 10' is prevented from performing its intended functionality.

Figure 1E:
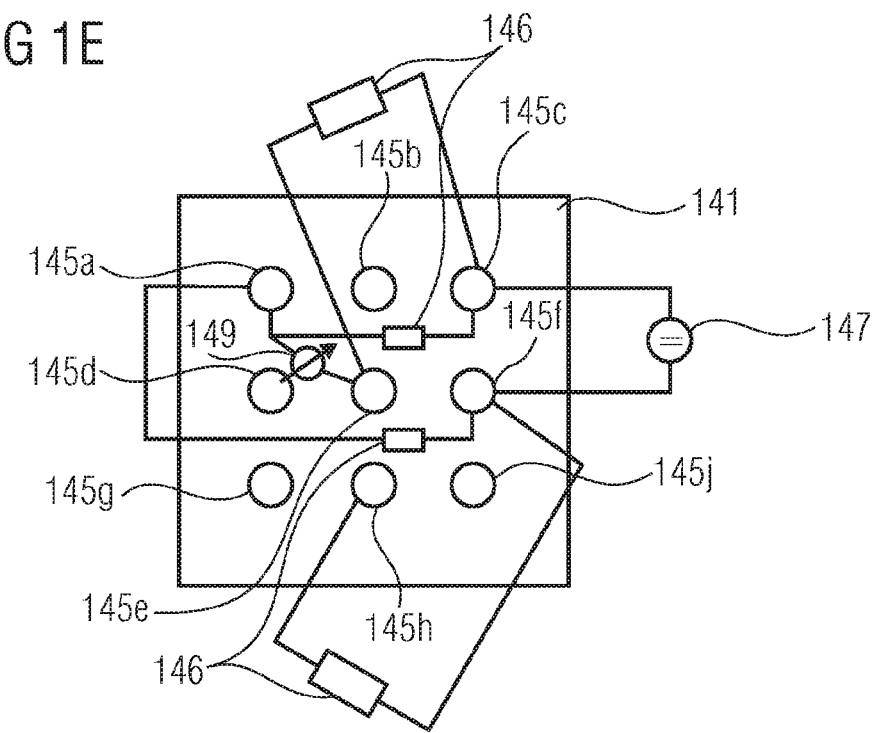

As became clear from the example of FIG. 1d, the anti-tamper circuit $114_1$ may be connected to anti-tamper circuitry 123 by means of more than two external contacts $120_4$ and $120_5$. This is also true in the embodiment of FIG. 1e. However, FIG. 1e concerns an embodiment where the anti-tamper circuit along with the anti-tamper circuitry 123 forms a Wheatstone bridge. In particular, FIG. 1e shows an exemplary footprint of IC-package 141 comprising an exemplary array of 3×3 electrode pads or external contacts 145a to 145j.

Via 4 of these external contacts, i.e. external contacts 145a, 145c, 145e and 145f, the anti-tamper circuit is connected to the anti-tamper circuitry 121. As schematically illustrated in FIG. 1e, the anti-tamper circuitry 121 defines electrically conductive paths in order to define resistances between contact pairs 145a-145c, 145c-145e, 145e-145f and 145f-145a, respectively. Furthermore, anti-tamper circuit $114_1$ comprises a voltage supply 147 for applying a voltage between two of these external contacts 145c and 145f, having two series circuits of two resistances 145a-d, respectively, connected therebetween in parallel. Finally, anti-tamper circuit $114_1$ comprises a voltage meter 149 for performing a voltage measurement between the other external contacts 145a and 145e. Therefore, according to the embodiment of FIG. 1e, a voltage measurement is performed by the anti-tamper circuit $114_1$ in order to determine as to whether a tampering attack is present and has significantly changed any of the resistances 145a-d, or not. The voltage value detected may be compared to a reference value or reference range obtained based on a value stored in memory 139 as described above with respect to embodiments of FIGS. 1c and 1d.

By use of the Wheatstone bridge comprising resistances 146, anti-tamper circuit $114_1$ may be sensitive to even small resistance changes due to a tampering with the system 10' by an unauthorized person. In particular, the use of the Wheatstone bridge may accommodate for variations in operation temperature and therefore avoid unwanted or unjustified error messages output by anti-tamper circuit $114_1$.

It should be noted that potentially, not all of the resistances are formed outside the IC $114_1$. Rather, some may be formed inside the IC $114_1$.

Figure 1F:
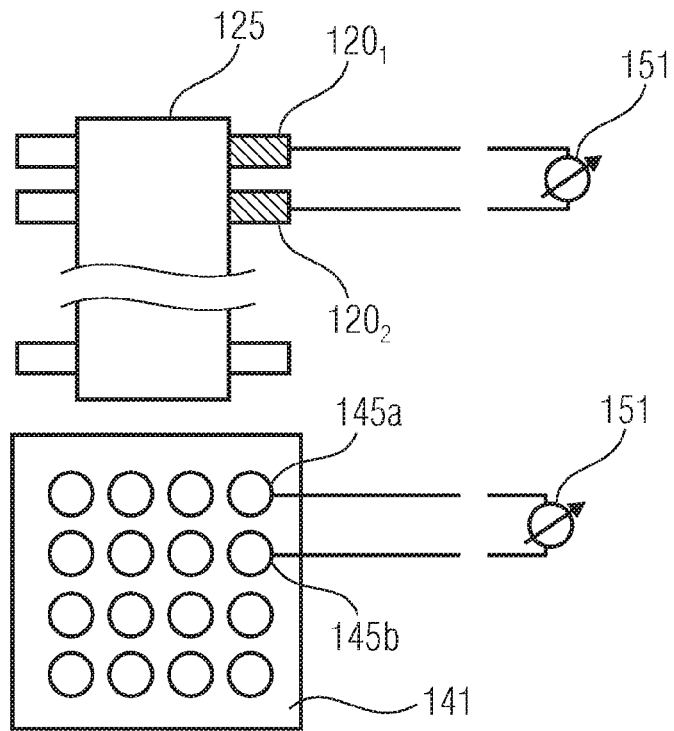
Figure 1G:
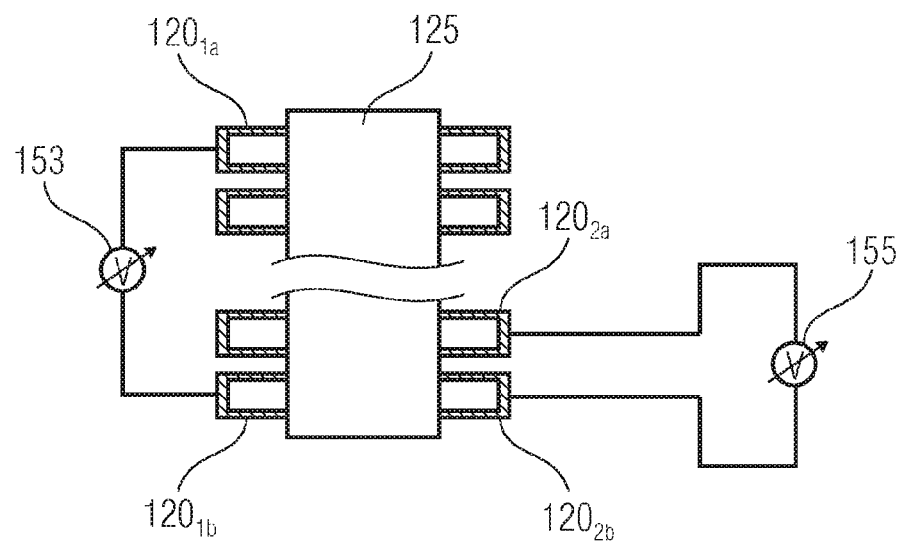

Further examples for enabling the continuous or intermittent surveyance of the intact state of system 10' are illustrated in FIG. 1f. In particular, the upper half of FIG. 1f shows an IC-package 125 with two of the package-leads or external contacts $120_1$ and $120_2$ serving as the external contacts via which the anti-tamper circuit $114_1$ performs a capacitive resistance measurement 151. The lower half of FIG. 1f shows an exemplary footprint of an IC-package 141 with two of the electrode pads or external contacts 145a and 145b serving as the external contacts via which the anti-tamper circuit performs a capacitive resistance measurement 151.

FIG. 1d, in turn, shows an example of an IC-package 125 according to which the anti-tamper circuit is designed to use two of the external contacts $120_a$ and $120_b$ for performing a resistance measurement 153 and another pair of external contacts $120_{2a}$ and $120_{2b}$ for performing a resistance measurement and/or a capacitive resistance measurement 155 with again using these values for deciding as to whether the current electrical states on these external contacts $120_{1a}$ and $120_{2b}$ indicate a tampering situation or not.

The above embodiments of FIG. 1c to FIG. 1d make clear that the anti-tamper circuit $114_1$ is responsive to an external interference in the contact 120 and soldier pads thereof as well as short-cuttings of conductor lines whereupon the anti-tamper circuit $114_1$ switches the integrated circuit 14a into a lock state in which the integrated circuit 14a prevents system 10' from performing its intended functionality. An unlocked state may be achievable only for authorized entities such as the system producer, by inputting a respective secret code into IC $114_1$.

For sake of clarity, it is again noted that the storage of pre-sensed electrical states into memory 139 or the imprinting of these values thereto is optional. Fixed or at least predetermined threshold values may be used instead. Furthermore, capacitive or inductive signal path measurements using predetermined signals may be used in order to detect manipulations or tampering events. Lastly, it is noted that the external contacts $120_4$ and $120_5$ in FIG. 1b may be replaced by just one external contact. For example, the anti-tampering circuit $114_1$ detects a tampering event by applying an AC signal on a single external contact and evaluating a resulting property of the AC signal at this single external contact, such as the amplitude or phase. Further, it is noted that the anti-tamper circuitry 123 is not necessarily distinct from the external circuitry 121. For example, part of the conductor lines between the external circuitry 121 and the normal-mode circuit $114_2$ as well as part of the external circuitry 121 may be reused to form the anti-tamper circuitry 123.

Regarding the above description, it should be noted that memory 139 is not restricted to flash memories. Rather, memory 139 may be a ROM, an EEPROM, a Phase-change memory or any other non-volatile memory. Further, it is noted that the anti-tamper circuit may be integrated into the same dice as circuit $114_2$. However, it is also possible that both circuits are integrated into different dices packaged into one common device package. Lastly, it should be noted that the anti-tamper circuit device could reside outside the integrated circuit 14a protected by cover 24. For example, the anti-tamper circuit could reside in the integrated circuit 14b. In this case, for example, both integrated circuits, i.e. the one protected by cover 24 and the one comprising the anti-tamper device, would contribute, at least partially, to the functionality of interest of the circuit board system.

The above mentioned description with reselect to FIGS. 1d to 1g mainly focused on the anti-tamper circuit and its functionality in connection with actively detecting a tampering event. The following description will focus now on the optional cover 24 that has already been mentioned above with respect to FIG. 1a. In particular, in the following, with respect to FIGS. 2a to 10, several embodiments for this cover will be described. Thereafter, several embodiments are described according to which the active detection by the anti-tamper circuit and the functionality of the cover are advantageously combined in order to achieve an even higher protection against the above-mentioned manipulation attacks.

Figure 2F:
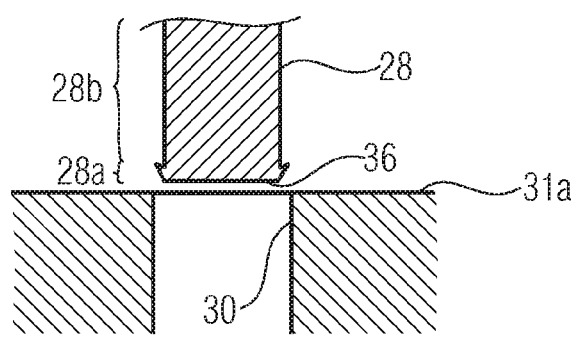
FIG. 2a to 2g show sectional views of an anchoring pin of a protective cap acting as a cover, as shown in FIG. 1 and a corresponding hole in the circuit board, according to various embodiments.
Figure 2A:
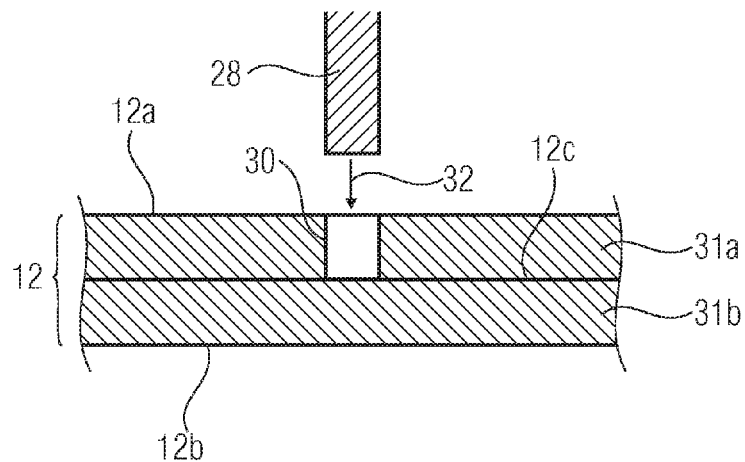

In FIGS. 2a to 2e, various embodiments for a pair of a hole 30 and a respective pin 28 are shown, so as to illustrate how this pair of hole 30 and anchoring pin 28 may contribute to, or provide for the "irreversible" affixation of the protective cap to the circuit board 12. In these figures, the circuit board 12 is exemplarily shown as a two-layer board comprising a first layer 31a and a second layer 31b. In the embodiment of FIG. 2a, hole 30 is a blind hole extending from mounting surface 12a to an interface 12c between layer 31a and 31b. Preferably, a cross-section of the anchoring pin 28 is adapted to a cross-section of hole 30 such, that the anchoring pin 28 is stuck in hole 30, as illustrated by arrow 32. The mechanical removal of anchoring pin 28 out of hole 30 should exert sufficient force on the circuit board 12 to destroy the circuitry of the circuit board 12, such as, for example, interrupt conductor lines interconnecting contact pads 22.

Figure 2B:
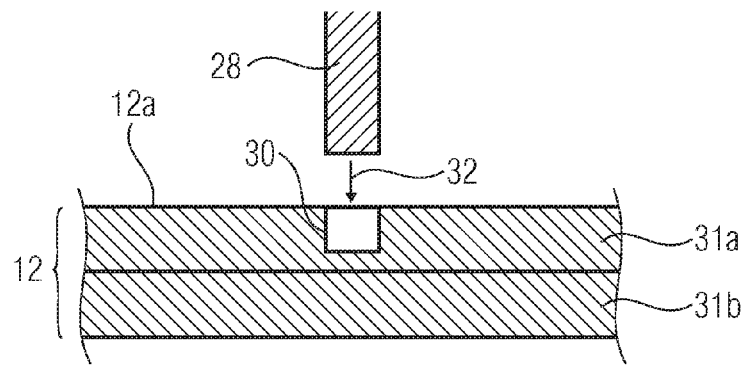

As shown in FIG. 2b, the length of the blind hole 30 may be shorter. In accordance with FIG. 2b the blind hole 30 extends from mounting surface 12a to a portion of the first layer 31a from the mounting surface 12a, the portion being internal to this layer 31a.

Figure 2C:
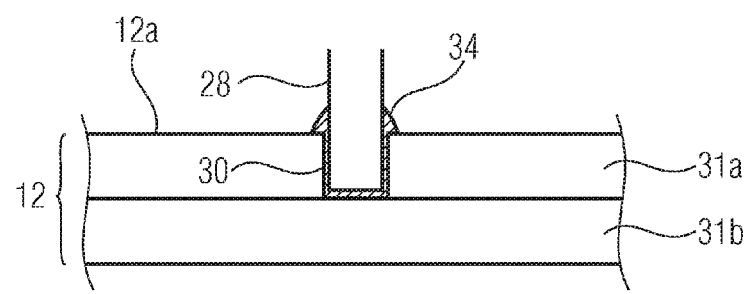

As shown in FIG. 2c it is possible that the anchoring pin 2B is held in the blind hole 30 by means of an adhesive 34. To this end, for example, adhesive 34 is filled into the blind hole 30 before inserting anchoring pin 28 into blind hole 30, whereby some of the adhesive 34 is eventually displaced from blind hole 30 as illustrated in FIG. 2c. Thereafter, a curing of the adhesive 34 could take place. For instance, the adhesive is selected such that it hardens by way of an irreversible hardening process in contrast to, for example, solder which is reversibly releasable by heating same to above its melting temperature.

Preferably, the adhesive 34 is selected such that same results in a stable mechanical connection between anchoring pin 28 and circuit board 12, so as to guarantee an irreversible anchoring of pin 28 in hole 30. Moreover, adhesive 34 is preferably selected such that same, in its hardened state, is substantially chemical inert. That is, adhesive 34 should withstand chemical substances, such as etch solutions and the like, at least to the extent that removing the adhesive 34 to release anchoring pin 28 from hole 30 unavoidably leads to a destruction of the circuitry implemented on circuit board 12 by, for example, interrupting conductor lines of the circuit board 12 connecting some of the contact pads 22.

Figure 2D:
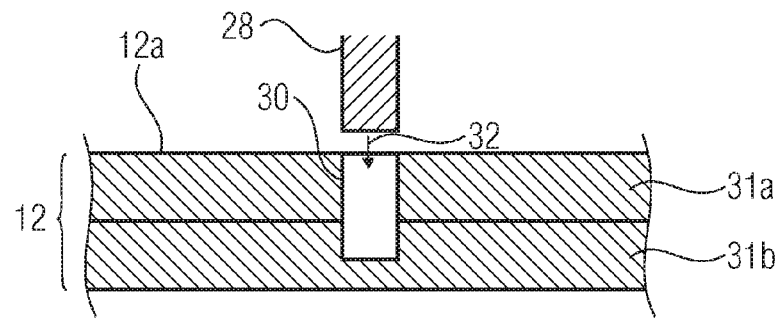

As shown in FIG. 2d, it is also possible that hole 30 is a blind hole extending from mounting surface 12a beyond the interface between layers 31a and 31b.

Figure 2E:
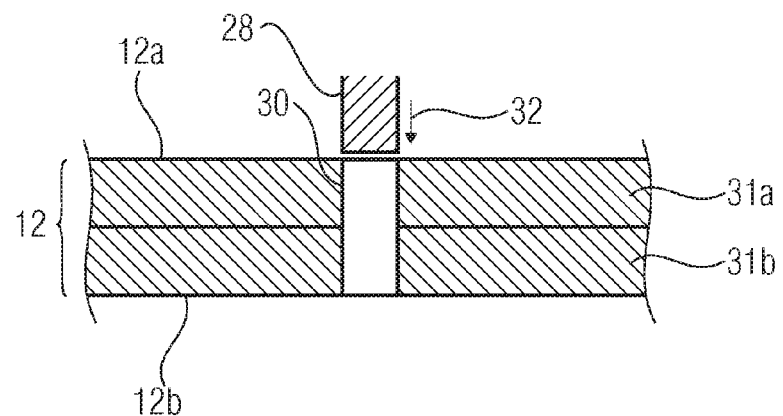

As shown in FIG. 2e, hole 30 could even be a through hole extending from mounting surface 12a to the opposing surface 12b of the circuit board 12.

As shown in FIG. 2f, in other to support the irreversible insertion of the anchoring pin 28 in hole 30, the distal end 38 of the anchoring pin 28 could be formed as a portion 28a having a greater diameter than a remaining proximal portion 28b of the anchoring pin 28. This could be achieved by, for example, mechanically deforming the distal end 36 of anchoring pin 28. Then, the anchoring pin 28 is inserted into hole 30. The larger diameter portion 28a enlarges the forces necessary in order to remove anchoring pin 29 out of hole 30, thereby increasing the likelihood that the circuit board 12 and its circuitry respectively, are destroyed by this removal.

Figure 2G:
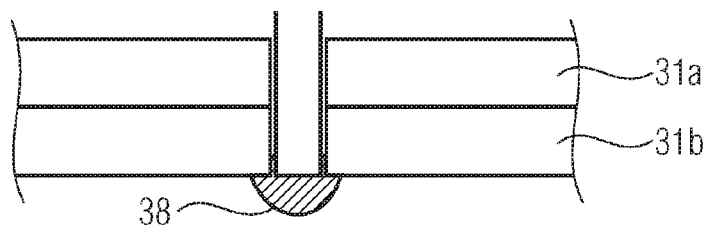

As shown in FIG. 2g, it is also possible that, in case of hole 30 being a through hole, the securing of the anchoring pin 28 in hole 30 could be achieved from the opposing surface 12b by, for example, solder 38 in case of the anchoring pin 28 being of metal.

It should be noted that the material of the protective cap 26 could be chosen from, for example, metal, ceramic, glass or plastic. In any case, it is preferred that the protective cap shows a high resistance against sawing, rasping, mechanical shocks and the like. Thus, it should be stable, and rigid without being brittle. Moreover, the material should be chemically inert so that a chemical attack on the protective cap 26 is likely to result in a destruction of the circuitry of the circuit board 12. For example, in order to achieve access to manipulate data on external contacts 20 of integrated circuit 14a, a potential attacker has to remove the protective cap 26. However, since the sidewall 26b of the protective cap is anchored in circuit board 12, this removal will unavoidably or will likely lead to a destruction of the circuit board 12 such that same is rendered useless. For example, in case of the material of the protective cap 26 being steel or an $Al_2O_3$ ceramic or a highly-filled epoxy resin, a removal of the protective cap 26 by means of chemical substances such as solvents, acids and bases is not possible without concurrently etching away the conductor lines of the circuit board 12, rendering the circuit board 12 useless. An attempt to mechanically achieve access to the external contacts 20 for manipulation such as, for example, by means of a polishing or milling attack, leads to tension and shearing stresses on the anchoring surface of the protective cap 26 within the circuit board material what, in turn, damages the conductor lines of the circuit board 12a such that, again, the board 12 becomes useless.

Figure 3A:
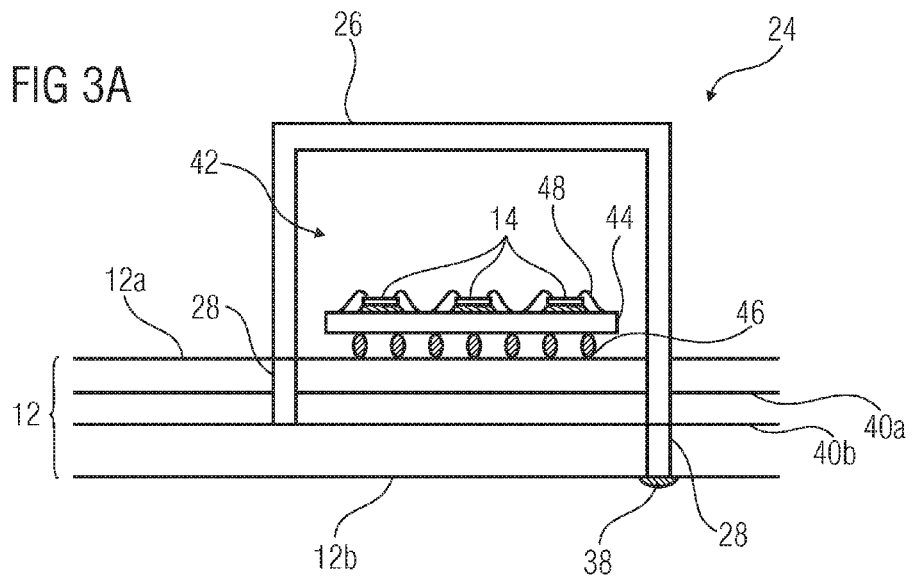
FIG. 3a shows a sectional side view of an arrangement of protective cap, chip module, and circuit boards according to another embodiment of the present invention.

Reference is now made to FIG. 3a. FIG. 3a shows a part of a circuit board 12 with two exemplarily shown conductor lines 40a and 40b extending internally to the circuit board 12. A chip module 42 comprising a chip support 44 having chips 14 mounted thereon, is mounted to the circuit board by means of solder connections such as solder bumps 46. In particular, external contacts of the chips 14 are electrically connected to the solder connections 46 via bond wires 48 and conductor paths (not shown) of the chip support, thereby connecting the chips 14 with some of the conductor lines of the circuit board which could be, but not necessarily, the conductor lines 40a and 40b of the circuit board 12 shown in FIG. 3a.

In the embodiment of FIG. 3a, the cover 24 also comprises a protective cap 26, as it was the case in FIG. 1. Moreover, the protective cap 26 also comprises anchoring pins 28 extending into circuit board 12. However, according to the embodiment of FIG. 3a, one of the anchoring pins 28 only partially extends into the circuit board 12, whereas the other anchoring pin 28 solely extends from the mounting surface 12a through the circuit board 12 to the opposing surface 12b, where the distal end of this anchoring pin is anchored to the circuit board 12 by means of solder 38. In other words, the circuit board 12 of FIG. 3a has a through hole for allowing one of the anchoring pins 28 to pass through the circuit board 12 to the opposing surface 12b, and a blind hole extending from the mounting surface 12a to a plane of the circuit board 12 where one 40a of the conductor lines laterally extends internally to the circuit board 12.

Figure 3B:
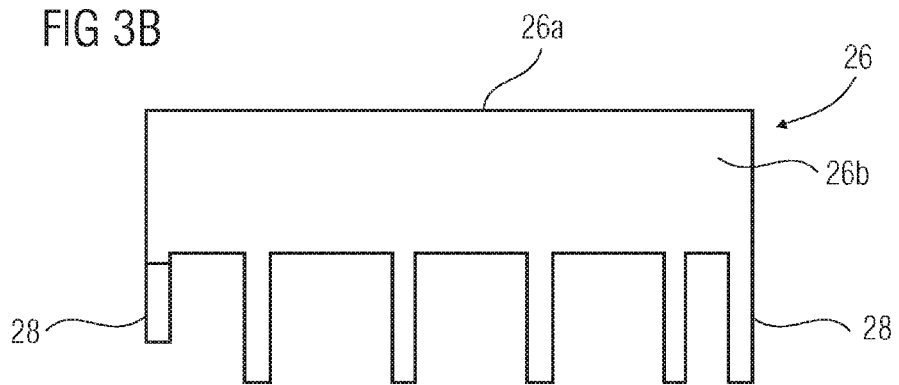
Figure 3C:
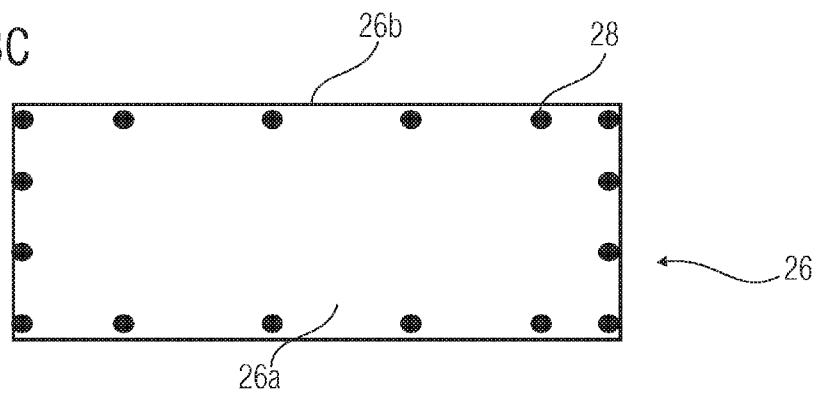

In FIGS. 3b and 3c, an example of the protective cap 26 is shown in more detail. As shown therein, the incoming pins 28 could have a round or circular cross-sectional shape. Moreover, the incoming pins 28 could be an integral part of the protective cap 26. For example, the protective cap 26 of FIG. 3a to 3c is made of thin steel and, in its anchored state, protectively surrounds the multi-chip module 42 from the outside like a cave.

As illustrated by the left hand anchoring pin 28 in FIG. 3a, an anchoring pin may abut to one of the conductor lines to be mechanically and, eventually, electrically connected therewith. The latter connection could be achieved by, for example, an adhesive as shown in FIG. 2c, or solder. In other words, the circuit board 12 could have a blind hole at which one of the conductor lines 40b is exposed, and in to which the anchoring pin 28 is to be inserted.

It should be noted that the sensitivity of the anchoring surface against mechanical stress is adjustable via the geometric parameter of the pin diameter, the distance of the anchoring pin to a respective conductor line as well as material selected. In this regard, a diameter of the anchoring pin is preferably greater than 0.1 times the thickness of the circuit board. A possible arrangement of the holes relative to the conductor lines will be exemplarily discussed in more detail with regard to FIGS. 5a and 5b.

Figure 4A:
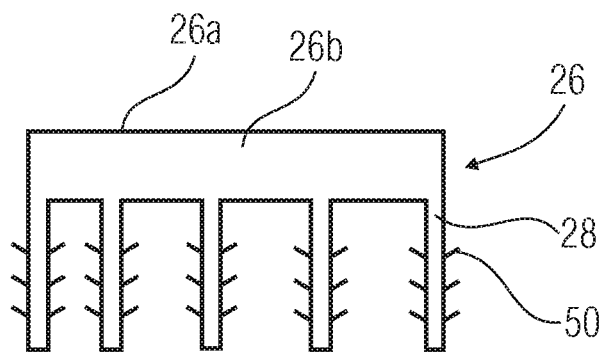
FIG. 4a shows a side view of a protective cap according to another embodiment of the present invention.
Figure 4B:
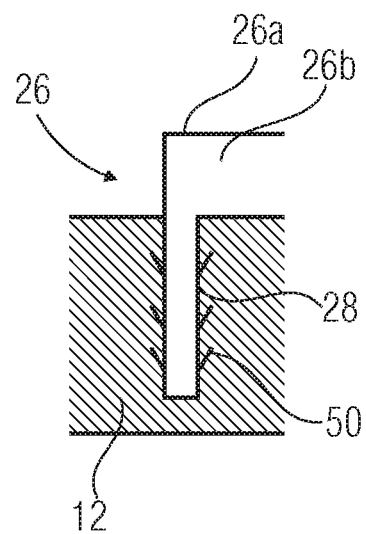
FIG. 4b shows a partial view of an anchoring pin of the protective cap of FIG. 4a in an affixed state.

However, prior thereto, FIGS. 4a and 4b show an example of a protective cap 26 comprising anchoring pins 28 according to which the anchoring pins 28 have a roughened outer surface or anchoring surface thereby forming hook portions which achieve an increased stability of adhesion to the circuit board 12, when inserted into same, as shown in FIG. 4b. As shown in FIG. 4b which shows the state in which the protective cap has been affixed to the circuit board 12, the insertion of the anchoring pin 28 into a hole of the circuit board 12 will tend to put the hook portions 50 against the side surface of the anchoring pin 28. Nevertheless, the hook portions 50 will increase the force necessary in order to remove the anchoring pin 28 out of the circuit board 12, preferably such that the removal unavoidably leads to the destruction of the circuit board 12.

In connection with FIGS. 3a to 3c, it has already been noted that it is preferable that holes 30 or at least one hole in the circuit board is placed in the vicinity of or even borders on conductor lines of the circuit board, contributing to the circuitry of the circuit board. Examples for such placement are shown in FIGS. 5a and 5b. FIG. 5a shows a hole 30. In particular, hole 30 is shown as being a through hole. However, as already noted with regard to FIGS. 2a to 2g, hole 30 may also be a blind hole. FIG. 5a also shows a conductor line 40 running internally to the circuit board 12 in a plane between layers 31a and 31b. According to FIG. 5a, conductor line 40 is exemplarily connected to a contact pad 22 arranged on the mounting surface 12a through a via 52. The contact pad 22 may be one to which the integrated circuit 14a to be protected or the chip module 42 including the same, respectively, is mounted and thus is within the protected area within the cover 24. However, the contact pad 22 may also be one of the contact pads 22 not being covered by cover 24. Additionally, the conductor line 40 may not be connected directly to one of the contact pads, but merely via another conductor line of the circuit board 12. In any case, preferably, the conductor line 40 is part of the circuitry of the circuit board 12, such that a certain functionality of this circuit board 12 does not work if the conductor line 40 of FIG. 5a is interrupted.

In accordance with FIG. 5a, hole 30 is placed in the vicinity of conductor line 40. The lateral distance d is preferably smaller than 1 mm and even more preferably smaller than 100 µm, so as to guarantee the interruption of conductor line 40 in case of a removal of the anchoring pin (not shown in FIG. 5a) inserted into hole 30. As already noted above, distance d could even vanish, such that hole 30 borders the conductor line 40. In case of an electrically conductive anchoring pin, a conductor line 40 could even have a discontinuity at the location of the hole 30, with the discontinuity being bridged by the anchoring pin inserted into hole 30.

FIG. 5b shows an example where the circuit board 12 is a three-layer circuit board composed of three layers 31a, 31b, and 31c, wherein a part 54 of hole 30 extending through the middle layer 31b serves as a via connecting a first conductor line 40a running in a plane between layers 31a and 31b, and a conductor line 40b running in a plane between layers 31c and 31b. As illustrated in FIG. 5b, it is possible that the inner wall 56 in at least portion 54 is covered with a conductive film connecting both conductor lines 40a and 40b prior to inserting the anchoring pin (not shown in FIG. 5b) into hole 30. Alternatively or additionally, the anchoring pin 28 may be made of a conductive material and serve as an electrical connection between conductor lines 40a and 40b in the inserted state. By this measure, the conductor lines 40a and 40b are disconnected in case of the anchoring pin being removed from hole 30.

In the above embodiments, the protective cap had anchoring pins extending into the circuit board for irreversible affixation to the circuit board. In the following, with regard to FIGS. 6a to 6d, embodiments are described where the affixation of the protective cap to the circuit board is achieved by adhesive. In these embodiments no portion of the protective cap extends into the circuit board.

Figure 6A:
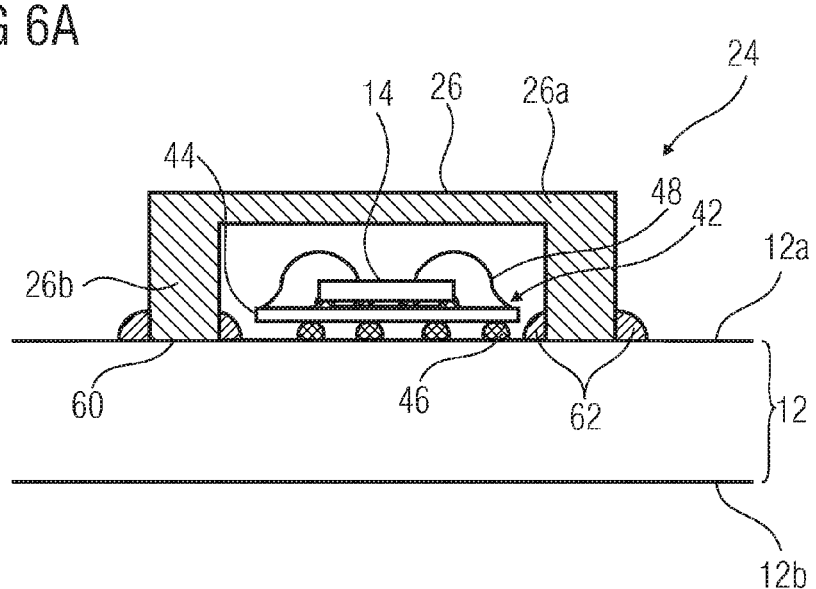
Figure 6B:
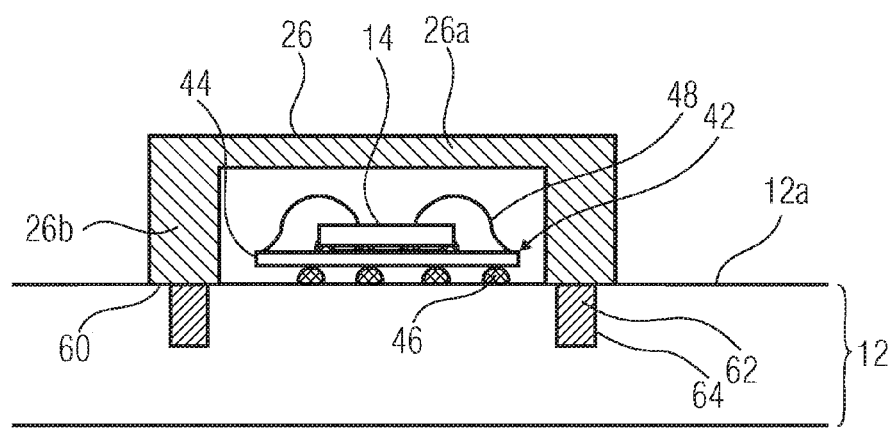

FIG. 6a shows an arrangement where a single chip module 42 is mounted to the mounting surface 12a of a circuit board 12. As described with respect to FIG. 3a, the chip module 42 comprises a chip support 44 supporting a chip 14 to be protected, the chip 14 being connected to conductor lines (not shown) of the circuit board 12 via bond wires 48 and solder connections 46. Instead of solder connections 46, electrically conductive adhesive may also be used.

In order to prohibit any external access to, for example, the bond wires 48 a cover 24 covers the whole chip module 42, as well as the contact pads (not shown), to which connections 46 are connected. As in the foregoing examples, cover 24 comprises a protective cap 26. However, no anchoring pin protrudes from the seat area 60 of cap 26 at the distal end of the sidewalls 26b facing circuit board 12. Rather, the seat area 60 of protective cap 26 abuts to the mounting surface 12a within a closed band thereof surrounding a mounting area of the chip module 42.

The protective cap 26 is affixed to the circuit board 121 by means of adhesive 62. As mentioned above with respect to adhesive 34 of FIG. 2c, adhesive 62 preferably provides a strong adhesion between cap 26 and circuit board 12, and shows preferably a high resistance towards chemical substances. In particular, the adhesive may be an irreversible hardening adhesive such as an irreversible hardening resin. Additionally, the protective cap 26 may be affixed to the circuit board such that the protective cap 26 is electrically isolated from any conductive part of the circuit board 12.

As described with respect to FIGS. 5a and 5b, it is preferred that conductor lines (not shown) of the circuit board 12 extending internally to the circuit board 12 are in the vicinity of the seat area 60 and, in particular, adhesive 62, both in terms of lateral distance and vertical depth. For example, in the case of a multi-layer substrate 12, conductor lines crossing seat areas 60 should run in interfaces between layers of the circuit board 12 nearest to, or at least near to mounting surface 12a, rather than opposing surface 12b, thereby increasing the likelihood of an interruption of these conductor lines in the case of removal of the protective cap 26 by force.

In the embodiment of FIG. 6a, the adhesive 62 is liable to an attack by means of chemical substances from outside. Therefore, in accordance with FIG. 6b, a recess 64 is formed in the mounting surface 12a so as to be overlapped by the seat area 60 of the protective cap 26 in the affixed state. The adhesive 62, affixing the protective cap 26 to the circuit board 12 is provided in the recess 64. By this measure, chemical substances for releasing the adhesion connection between the protective cap 26 and the circuit board 12 may not easily be brought into contact with adhesive 62.

In accordance with the embodiment of FIG. 6c, compared to the embodiment of FIG. 6a, a recess or step 66 is formed in an edge between an inner surface 68 of the sidewall 26b and the seat area or seat surface 60, wherein the adhesive 62 is arranged in this recess 66 in order to provide for the mechanical connection between the protective cap 26 and the circuit board 12. Similar to the embodiment of FIG. 6b, the adhesive 62 arranged in recess 66 is protected against chemical attacks from outside.

In accordance with the embodiment of FIG. 6d, the enclosed apace between the protective cap 26 and the circuit board 12 is almost completely filled with the adhesive 62, the adhesive 62 contacting the inner surface 68 of sidewall 26b, the inner surface of ceiling 26a, as well as the portion of the mounting surface 12a encircled by seat area 60, thereby achieving the mechanical connection between the protective cap 26 and circuit board 12, and being, concurrently, protected against chemical attacks from outside.

Figure 7A:
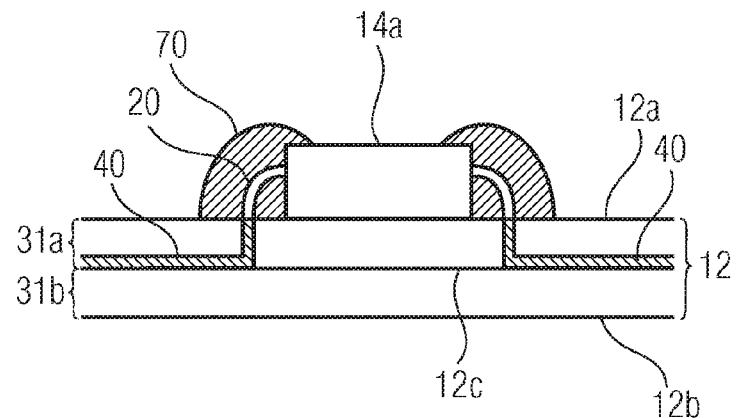
FIG. 7a to 7d show sectional side views of an arrangement of a circuit board and an integrated circuit board mounted thereon, with a resin being provided for protection, according to further embodiments of the present invention.

In the embodiments described above, cover 24 comprised a protective cap made up of, for example, metal, ceramics, glass, or plastic. Differing therefrom, in the embodiments of FIG. 7a to 7d, a coverage of the externally accessible connection structure to connect the integrated circuit to be protected, such as the external contact 20, the bond wires 48 and the solder connections 46, respectively, is achieved by resin which is, for example, non-conductive. FIG. 7a shows, for example, an integrated circuit 14a being mounted on a mounting surface 12a of a circuit board 12, wherein the external contacts 20 of the integrated circuit 14a are completely covered by a resin 70 being disposed on the external contact 20. As shown in FIG. 7a, the resin 70 preferably not only completely covers the external contacts 20, but also adheres to mounting surface 12a as well as the outer surface of integrated circuit 14a. Accordingly, resin 70 may be an adhesive and could comply with the abovementioned requirements with respect to a strong adhesion and/or chemical resistance. Resin 70 prevents an external access to the external contacts 20 and guarantees that the circuit board 12 and its circuitry are destroyed upon a forcible removal of the resin 70.

Figure 7B:
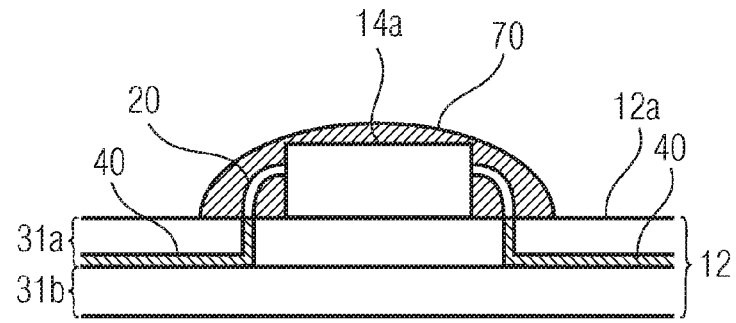

Differing from FIG. 7a where the disposal of resin 70 was restricted to portions through which the external contacts 20 extended, in the embodiment of FIG. 7b resin 70 is completely disposed over the whole integrated circuit 14a, including the external contacts 20, so as to cover both the integrated circuit 14a and the external contacts 20.

Figure 7C:
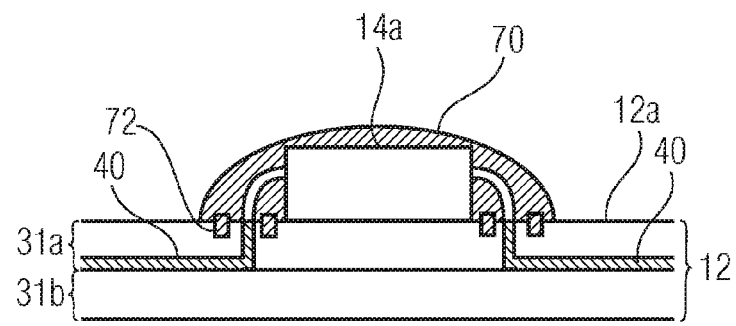
Figure 7D:
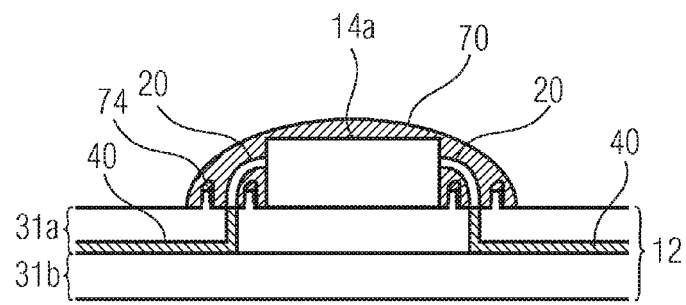

FIG. 7c shows recesses 72 formed in the mounting surface 12a of the circuit board 12, in an area where resin 70 adheres to the mounting surface 12a, in order to increase the adhesion force by which resin 70 is affixed to mounting surface 12a. Similarly, FIG. 7d shows protrusions 74 protruding from the mounting surface 12a in the area of the mounting surface 12a where resin 70 touches or adheres to mounting surface 12a so as to increase the adhesion force. Of course, it is possible to mix up protrusions 74 and recesses 72 in order increase the adhesion force, and/or to use just one protrusion/recess.

Figure 8:
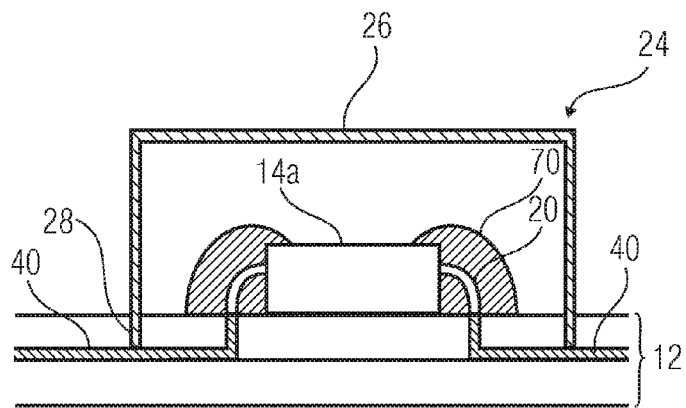
FIG. 8 shows a sectional side view of an arrangement of a circuit board and an integrated circuit mounted thereon with a protection comprising a protective cap and resin, according to another embodiment of the present invention.

Of course it is possible to combine the embodiments according to FIGS. 7a to 7d with any other of the aforementioned embodiments with respect to FIGS. 1a and 2a to 6d. FIG. 8, for example, shows a cover 24 comprising both a protective cap 26 of, for example, a rigid material as well as a resin 70 covering the external contacts 20, the protective cap 26 protecting or enclosing both the resin 70, as well as integrated circuit 14a. For example, the resin 70 may take up more than 50% of the space enclosed by the protective cap 26 and circuit board 12 and surrounding the integrated circuit 14a such that the resin 70 contacts the protective cap 26 from inside similar to FIG. 6d. In FIG. 8, the holes in the circuit board 12 for accommodating the anchoring pins 28 of the protective cap 26 abut to the internal conductor lines 40 of the circuit board 12, and the resin 70 does not completely cover the integrated circuit 14a. However, as already described above, these examples may be modified as indicated above.

Figure 9:
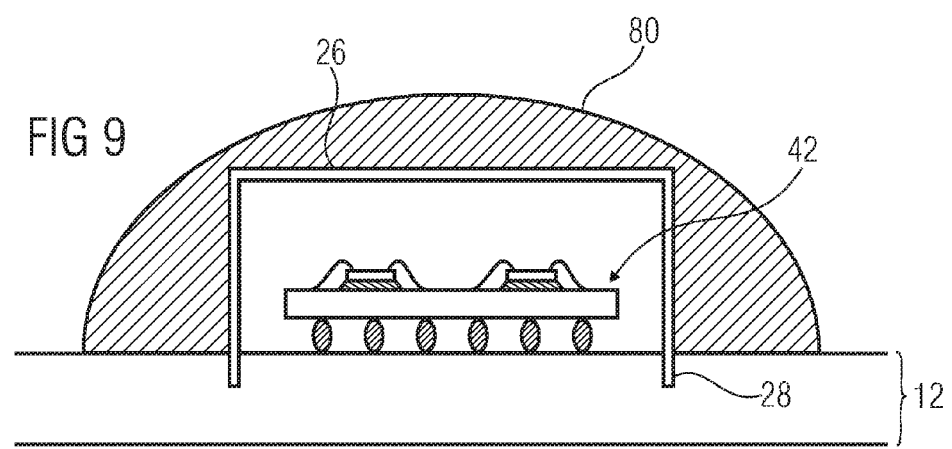
FIG. 9 shows a side view of a protective cap additionally covered by resin according to another embodiment of the present invention.

The above-described embodiments may be modified in various ways. With respect to the embodiment of FIGS. 1 to 6d, for example, it is noted that the protective cap 26 itself may be completely covered by a stabilizing globe top 80, so as to avoid an unintentional destruction of the circuit board due to, for example, hitting the protective cap 26. This is shown in FIG. 9.

Figure 10:
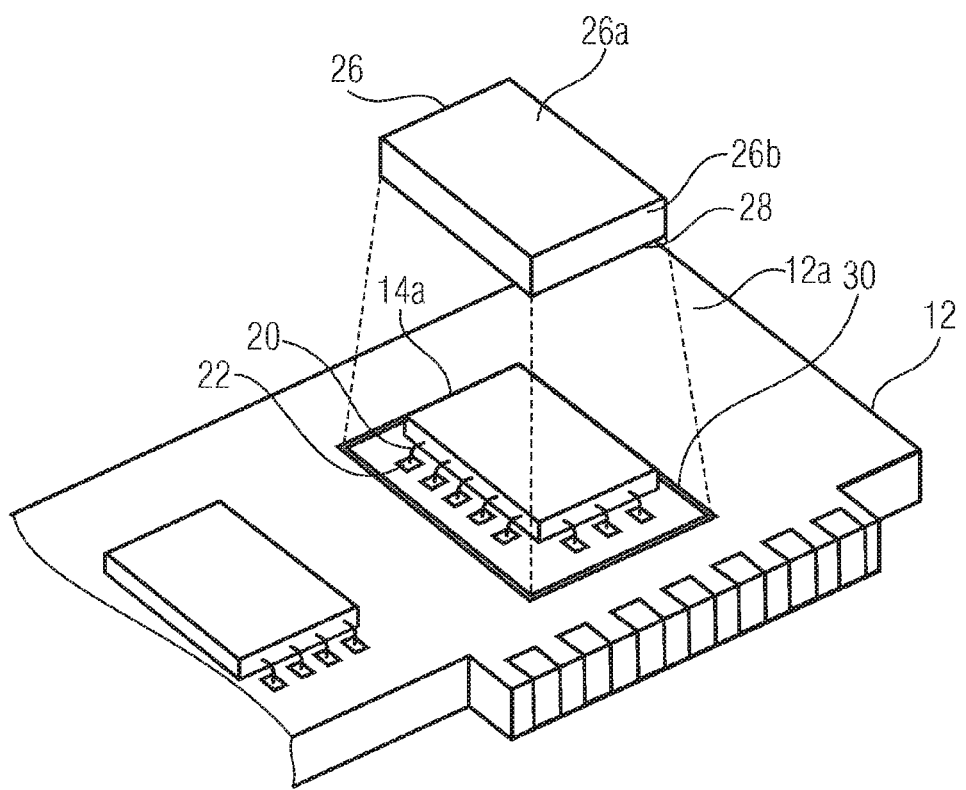
FIG. 10 shows a perspective view of a circuit board and its protection according to a further embodiment of the present invention.

Moreover, with regard to FIG. 10, it is noted with respect to the embodiments of FIGS. 1a and 2a to 5b, that just one anchoring pin may be provided as well. The anchoring pins may also not necessarily have to have an aspect ratio according to which the vertical length, i.e. the length along which the anchoring pin is inserted into the hole, is greater than the greatest lateral extension of the anchoring pin. As it is shown in FIG. 10, for example, the distal end portion of the sidewall 26b itself may be used as an anchoring portion extending into the circuit board 12. To this end, a trench like hole 30 is formed in the mounting surface 12a of the circuit board 12, the trench like hole encircling the integrated circuit 14a including the external contacts 20 and the respective contact pads 22, so as to conform with the circumference or seat area of the sidewall 26b, and allow an insertion of the distal end portion as an anchoring portion 28 into hole 30.

In the description of the above embodiments, the description mostly related to the already assembled state. However, according to another embodiment of the present invention, the aforementioned protective cap comprising the anchoring pin or portion, respectively, has not yet been inserted into the respective hole. Accordingly, the protective cap and circuit board form a kit. During a fabrication or a protection step, the already mounted integrated circuit may be protected by means of the protective cap with eventually, as described above, using adhesive or soldering. Moreover, various ways in order to dispose the aforementioned resin on top of the external contacts and/or the integrated circuit to be protected are possible.

In any case, the above embodiments involving cover 24 prevent the portions where a manipulator may access the signals of interest to/from the integrated circuit, on the circuit board against being exposed by means of simple chemical or physical preparation. In particular, the above embodiments protect an integrated circuit or a chip module to the extent that a respective preparative attack for exposing the terminals of the integrated circuit either involves overheads or costs in an unattractive amount that exceeds the value of the computer system, or that such a preparative attack unavoidably leads to the destruction of the board surface, rendering the board useless. Thus, the above embodiments may be used to protect integrated circuit from removal from the circuit board without destroying the board. Thus, a device containing the integrated circuits may be given to a consumer at, for example, a reduced price with the obligation to use that device only with services from a certain provider. For example, the device including one of the above circuit boards could be programmed to be only functional using circuitry from a specific provider residing inside the integrated circuit 14a.

In the above embodiments of FIGS. 1a to 10, the active tamper detection performed by the anti-tamper circuit on the one hand and the tamper resistivity provided by cover 24 on the other hand may be combined in such a way that tampering with the system composed of the circuit board and the integrated circuit is even more difficult. For example, any attempt to get past cover 24 by an unauthorized person in order to manipulate the signals into/out integrated circuit 14a may result in triggering the anti-tamper circuit due to the necessary physical attacks necessary to get past cover 24. For example, material-removing measures such as etching or rasping, may lead to capacitance or impedance changes and/or interruptions of the electrical path between two measurement points/external contacts $102_4$ and $102_5$, for example, so that the attack, in turn, is detectable by anti-tamper circuit. In order to enhance the sensitivity of the anti-tamper circuit against chemical and/or mechanical attacks against cover 24, the anti-tamper circuitry 123 may be at least partially formed in the vicinity of locations where cover 24 is affixed to circuit board 12. For example, conductor lines of circuit board 12 contributing to anti-tamper circuitry 123 may extend in the vicinity of an anchoring pin just as it has been described in FIG. 5a for conductor line 40, with a distance d being, for example, less than 1 mm. The embodiment according to FIG. 5b is also transferable to the conductor lines involved in anti-tamper circuitry 123. Moreover, the anti-tamper circuitry 123 may comprise two connection points where the anti-tamper circuitry electrically contacts protective cap 26 with the protective cap being electrically conductive so that the protective cap 26 itself defines an electric sub-path serially connected between external contacts $102_4$ and $102_5$, for example. However it is also possible that the anti-tamper circuitry 123 electrically contacts protective cap 26 merely at one point in order to enable the anti-tamper circuitry to evaluate the capacitance contribution of the protection cap, with the protection cap being electrically conductive.

In other words, the aforementioned cover 24 may comprise a metallic cap affixed to the circuit board to cover integrated circuit 14a. Sidewalls of the cap may be anchored into the circuit board such that the cap is integrated into the electrical conductor line system of the circuit board. There are several options. In any case, a removal of the cap should result in the functionality of the system getting irreversibly lost for persons other that the manufacturer. Any attempt to expose the external contacts below the cap by, for example, filing or milling, exemplarily unavoidably lead to a destruction of the functionality of the board/system. The cap itself may additionally be fixed to the circuit board by means of a heat and/or UV curable adhesive. In this regard, the cap may be designed such that the adhesive seam is inaccessible from outside the cap for chemical solvents, acids or bases. By this measure, the cap may provide for an additional protection against a preparative wet etching release of the cap. To be even more concrete, the cap may consist of thin steel and may have legs at its seat serving as vias within the conductor paths running through the circuit board and thus serving as a portion of the electrically active structure of the circuit board. The legs or anchoring pins may be soldered into the via holes of the circuit board. However, the use of conductive adhesives, such as silver based adhesives, both fixing the anchoring pins to the via hole and providing the electrical contact between the anchoring pins and the metal layers of the circuit board, is also possible. Any attempt to remove the metallic cap will unavoidably or automatically interrupt the electrical via connection between at least two different metal layers or conductor lines layers of the circuit board resulting in the functionality of the board getting lost. According to a further embodiment, the metallic cap forms a certain capacitance along with the contacting conductor lines and, optionally, the anchoring pins. This capacitance value may be stored within the protected integrated circuit, namely in the memory 139 and may serve as a control signal or alarm signal. In case of an interruption of the conductor line due to, for example, a removal of the cap or a release of any of the anchoring pins, the capacitance value changes, and the anti-tamper circuit may switch off a part of the system necessary for the intended functionality of the system. In even other words, the above embodiments showed an active protection of a chip on a circuit board, with "active" meaning, in accordance with some of the embodiments for example, that an electronic circuit is integrated in the chip that detects manipulation of the PC board circuit, the chip or the chip package, and in case sends out an alarm. Manipulation detection can be achieved, for example, by means of measuring resistances or inductances between chip pins, measuring capacitances between chip and a protection cap, measuring temperature, etc. some embodiments for which have been described above.

The anti-tamper circuit does not necessarily have to be hard-wired. The anti-tamper circuit may comprise a computer program running in the integrated circuit 14a with this computer program automatically switching off the board system. Additionally and/or alternatively, an inductivity value may be permanently or intermittently polled and compared to a target value. Merely in case of the measured value being within the predetermined limit, the operation of the system is enabled. Thus, in this case, both a protection against preparative exposure of the external contacts by means of mechanical tools such as a file or milling machine and a protection against a wet chemical attack by removing the cap is provided.

While the foregoing has been particularly described with reference to particular embodiments thereof, it will be understood by those skilled in the art that various other changes in the forms and details may be made without departing from the broader spirit and scope thereof. It is to be understood that various changes may be made in adapting to different embodiments without departing from the broad concept disclosed herein, and comprehended by the claims that follow.

The invention claimed is:

1. A system comprising:
a circuit board;
an integrated circuit device mounted on the circuit board by means of an external contact,
and comprising an anti-tamper device being connectable to the external contact to switch the integrated circuit device into a safe mode upon application of a predetermined electrical state at the external contact, wherein the anti-tamper device comprises a first resistor forming, along with a second resistor arranged external to the anti-temper circuit at the circuit board, which is connected to the first resistor via the external contact, a Wheatstone bridge; and
a cover connected to the circuit board, the cover covering the external contact and the integrated circuit device,
wherein the cover comprises a protective cap being affixed to the circuit board so that the integrated circuit device is enclosed by the protective cap and the circuit board and external access to the external contacts is prohibited by the protective cap,
wherein the system further comprises a resin being cast onto the integrated circuit device and/or the external contacts such that external access to the external contacts is prohibited by the resin,
wherein the integrated circuit and the resin are enclosed by the protective cap and the circuit board, wherein the resin touches an area of a surface of the circuit board surrounding the integrated circuit device, wherein the circuit board comprises at least one protrusion in the area of the surface of the circuit board surrounding the integrated circuit device: and wherein the cover comprises a metallic material forming a capacitance value that is stored in the integrated circuit device such that any deviance from the stored capacitance value signals a potential tamper.

2. The system according to claim 1 wherein the protective cap is affixed to the circuit board by at least one of at least one anchoring portion extending into the circuit board, and an irreversibly hardening adhesive.

3. A system comprising:
a circuit board;
an integrated circuit device mounted on the circuit board by means of an external contact, and comprising an anti-tamper device being connectable to the external contact to switch the integrated circuit device into a safe mode upon application of a predetermined electrical state at the external contact;
wherein the anti-tamper device comprises a first and a second resistor forming a Wheatstone bridge, the second resistor arranged external to the anti-temper device at the circuit board and connected to the first resistor via the external contact; and
a cover connected to the circuit board, the cover covering the external contact and the integrated circuit device, wherein the cover comprises a resin being cast onto the external contacts, along with or without the integrated circuit, and subsequently hardened such that the external access to the external contacts is prohibited by the resin; wherein the cover comprises a metallic material forming a capacitance value that is stored in the integrated circuit device such that any deviance from the stored capacitance value signals a potential tamper.

4. A system comprising:
a circuit board;
an integrated circuit device mounted on the circuit board by means of an external contact,
and comprising an anti-tamper device being connectable to the external contact to switch the integrated circuit device into a safe mode upon application of a predetermined electrical state at the external contact;
wherein the anti-tamper device comprises a first and a second resistor forming a Wheatstone bridge, the second resistor arranged external to the anti-temper device at the circuit board and connected to the first resistor via the external contact; and
a cover connected to the circuit board, the cover covering the external contact and the integrated circuit device, wherein the cover comprises a protective cap being affixed to the circuit board so that the integrated circuit device is enclosed by the protective cap and the circuit board and external access to the external contacts is prohibited by the protective cap, wherein the protective cap is affixed to the circuit board by at least one anchoring portion extending into the circuit board, wherein the circuit board has a conductor line extending internally thereto, the conductor line being electrically connected to the external contact, and wherein the at least one anchoring portion extends into the circuit board so that the anchoring portion touches or extends at a distance to the conductor line of the circuit board, the distance between the at least one anchoring portion and the conductor line being less than 1 mm;
wherein the cover comprises a metallic material forming a capacitance value that is stored in the integrated circuit device such that any deviance from the stored capacitance value signals a potential tamper.

5. The system according to claim 4, wherein the anchoring portion is an anchoring pin, and a diameter of the anchoring pin is greater than 0.1 times the thickness of the circuit board.

6. The system according to claim 4, wherein the anchoring portion is an anchoring pin, and the anchoring pin comprises a smaller diameter portion and a larger diameter portion, a diameter of the anchoring pin in the smaller diameter portion being less than a diameter of the anchoring pin in the larger diameter portion, and the larger diameter portion being located at a distal location relative to the smaller diameter portion.

7. The system according to claim 4, wherein the at least one anchoring portion comprises a hook portion engaging with the circuit board so as to counteract a movement of the anchoring portion out of the circuit board.

8. The system according to claim 4, wherein the circuit board comprises at least one hole into which the anchoring portion is inserted.

9. The system according to claim 8, wherein the at least one hole is a through hole extending from a first surface of the circuit board onto which the integrated circuit device is mounted to a second surface of the circuit board being opposite to the first surface.

10. The system according to claim 4, wherein the at least one anchoring portion is affixed to the circuit board by means of solder.

11. The system according to claim 4, wherein the at least one anchoring portion is affixed to the circuit board by means of adhesive.

12. The system according to claim 4, wherein the resin touches an area of a surface of the circuit board surrounding the integrated circuit device, wherein the circuit board comprises at least one recess in the area of the surface of the circuit board surrounding the integrated circuit device.

13. The system according to claim 12, wherein the resin takes up more than 50% of the space enclosed by the protective cap and circuit board and surrounding the integrated circuit device such that the resin contacts the protective cap from inside.

14. A system comprising
a circuit board;
an integrated circuit device mounted on the circuit board by means of an external contact,
and comprising an anti-tamper device being connectable to the external contact to switch the integrated circuit device into a safe mode upon application of a predetermined electrical state at the external contact;
wherein the anti-tamper device comprises a first and a second resistor forming a Wheatstone bridge, the second resistor arranged external to the anti-temper device at the circuit board and connected to the first resistor via the external contact; and
a cover connected to the circuit board, the cover covering the external contact and the integrated circuit device,
wherein the cover comprises a protective cap being affixed to the circuit board so that the integrated circuit device is enclosed by the protective cap and the circuit board and external access to the external contacts is prohibited by the protective cap, wherein the protective cap is affixed to the circuit board by means of an irreversibly hardening adhesive, with a recess being
formed in a portion of the circuit board facing a seat area of the protective cap or a step being formed in an edge of the protective cap formed between an inner wall of the protective cap and the seat area, and with the irreversibly hardening adhesive being at least partially disposed in the recess or step;
wherein the cover comprises a metallic material forming a capacitance value that is stored in the integrated circuit device such that any deviance from the stored capacitance value signals a potential tamper.

15. The system according to claim 4, wherein the resin is non-conductive.

16. The system according to claim 4, wherein the protective cap is affixed to the circuit board such that the protective cap is electrically isolated from any conductive part of the circuit board.

17. The system according to claim 4, wherein the irreversibly hardening adhesive is a resin.

18. The system according to claim 1, wherein the irreversibly hardening adhesive covers an area of a surface of the circuit board surrounding the integrated circuit device, and wherein the circuit board comprises at least one conductor line extending in the vicinity of the irreversibly hardening adhesive and being connected to the external contact.

19. A system according to claim 4, wherein the integrated circuit device has an encrypting unit.

20. A system according to claim 4, wherein the conductor line is a buried conductor line.

21. A system according to claim 4, wherein the circuit board is a multi-layer circuit board comprising a plurality of conductor lines at different layers of the multi-layer circuit board, and two of the conductor lines at different layers of the multi-layer circuit board are electrically connected to each other via the anchoring portion.

22. A system according to claim 4, wherein the circuit board is a multi-layer circuit board comprising a plurality of conductor lines at different layers of the multi-layer circuit board, and two of the conductor lines at different layers of the multi-layer circuit board are electrically connected to each other via a conductive film at an inner wall of the hole.

23. A system according to claim 4, wherein the circuit extends into the circuit board so that the anchoring portion extends offset from, at a distance to, the conductor line of the circuit board, the distance between the at least one anchoring portion and the buried conductor line being less than 1 mm.

24. The system according to claim 3, wherein the resin touches an area of a surface of the circuit board surrounding the integrated circuit device, wherein the circuit board comprises at least one recess or protrusion in the area of the surface of the circuit board surrounding the integrated circuit device.

25. The system according to claim 14, wherein the irreversibly hardening adhesive is non-conductive.

26. The system according to claim 14, wherein the irreversibly hardening adhesives is at least partially disposed in the step being formed in the edge of the protective cap form between the inner wall of the protective cap and the seat area.

27. The system of claim 3, wherein the resin is cast onto the external contacts and the integrated circuit such that the resin conforms to outer surfaces of the external contacts and the integrated circuit.

28. The system of claim 24, wherein the resin is cast onto the external contacts, the integrated circuit and the area of the surface of the circuit board surrounding the integrated circuit device such that the resin conforms to outer surfaces of the external contacts, the integrated circuit, and the area of the surface of the circuit board surrounding the integrated circuit device, including the at least one recess or protrusion.

29. The system according to claim 16, wherein the at least one anchoring portion protrudes from and is integrally part of the protective cap.

30. The system according to claim 23, wherein the at least one anchoring portion protrudes from and is integrally part of the protective cap.

31. The system according to claim 4, further comprising a non-volatile memory integrated into the integrated circuit device, with the anti-tamper device being adapted to detect a presence of the predetermined electrical state by comparing an electrical state at the external contact with target data being based on data stored in the non-volatile memory.

32. The system according to claim 4, wherein the anti-tamper circuit being designed such that a presence of the predetermined electrical state is detected merely in case of applying mechanical, chemical, and/or temperature stress to the system.

33. The system according to claim 4, wherein the anti-tamper circuit is adapted such that the electrical state depends on a resistance, a capacity and/or inductivity at the external contact.

34. A system according to claim 4, wherein an electrical path extends from the external contact through the circuit board to another external contact of the integrated circuit device to electrically couple both external contacts.

35. The system according to claim 4, wherein the at least one anchoring portion protrudes from and is integrally part of the protective cap.

* * * * *